United States Patent [19]
Takeda et al.

[11] Patent Number: 4,894,696
[45] Date of Patent: Jan. 16, 1990

[54] DYNAMIC RANDOM ACCESS MEMORY HAVING A TRENCH CAPACITOR

[75] Inventors: Eiji Takeda, Koganei; Kiyoo Itoh, Higashikurume; Ryoichi Hori, Tokyo; Katsuhiro Shimohigashi, Musashimurayama; Katsutaka Kimura, Sagamihara, all of Japan

[73] Assignee: Hitachi, Ltd., Tokyo, Japan

[21] Appl. No.: 938,967

[22] Filed: Dec. 8, 1986

[30] Foreign Application Priority Data

Dec. 10, 1985 [JP] Japan ................................ 60-276076

[51] Int. Cl.⁴ .......................................... H01L 29/78
[52] U.S. Cl. ..................................... 357/23.6; 357/55; 437/984
[58] Field of Search ................. 357/23.6, 55; 437/919, 437/984

[56] References Cited

U.S. PATENT DOCUMENTS

| | | | |
|---|---|---|---|
| 4,366,613 | 1/1983 | Ogura | 357/23.6 |
| 4,397,075 | 8/1983 | Fatula | 357/23.6 |
| 4,403,394 | 9/1983 | Shepard | 357/23.6 |
| 4,672,410 | 6/1987 | Miura et al. | 357/23.11 |
| 4,673,962 | 6/1987 | Chatterjee | 357/23.6 |
| 4,683,486 | 7/1987 | Chatterjee | 357/23.6 |
| 4,688,063 | 8/1987 | Lu | 357/23.6 |
| 4,721,987 | 1/1988 | Baglee et al. | 354/23.6 |
| 4,791,463 | 12/1988 | Malhi | 357/23.6 |

FOREIGN PATENT DOCUMENTS

| | | | |
|---|---|---|---|
| 55-55557 | 4/1980 | Japan | 357/23.6 |
| 61-6857 | 1/1986 | Japan | 357/23.6 |

OTHER PUBLICATIONS

IBM Technical Disclosure Bulletin, vol. 26, #5, pp. 2597-2599, Oct. 1983, by Chao Primary Examiner—Andrew J. James
Assistant Examiner—Mark Prenty
Attorney, Agent, or Firm—Antonelli, Terry & Wands

[57] ABSTRACT

A very highly integrated semiconductor memory which enables the dynamic random access memory to develop less soft error and to eliminate margin for aligning the masks, that hinders the device from being highly integrated. The memory cell capacitor is constituted by a trench which is provided at a position defined by an insulator formed on the side of gate electrode of a MOS transistor that constitutes the memory cell. Therefore, the MOS transistor and the trench capacitor are self-aligned, and no margin is required for alignment.

30 Claims, 5 Drawing Sheets

DYNAMIC RANDOM ACCESS MEMORY HAVING A TRENCH CAPACITOR

BACKGROUND OF THE INVENTION

The present invention relates to a semiconductor device having a trench capacitor in which at least a portion thereof is formed in a semiconductor substrate. More specifically, the invention relates to a semiconductor device that can be suitably adapted to a dynamic memory cell of a large scale.

In the conventional STC's (stacked capacitor cells, Koyanagi et al., IEEE, J. Solid-State Circuits, SC-15, No. 4, p. 661, 1980), the capacitors are all formed on a semiconductor substrate irrespective of whether they have a planar structure or a three-dimensional structure (Takemae et al., IEEE, ISSCC, p. 254, 1985). As the size of the element is reduced, therefore, it becomes difficult to maintain a sufficient capacity against soft error caused by alpha particles. With the three-dimensional structure, furthermore, if the surface irregularity is increased to increase the capacity, the word lines tend to be easily broken down.

A device in which a trench sidewall is formed in the semiconductor substrate to increase the capacity has been disclosed in "Sunami et al., A Corrugated Capacitor Cell (CCC) for Megabit Dynamic MOS Memories, IEEE, IEDM, Technical Digest, pp. 806–808, 1982".

However, this cell has problems in that (1) the capacity increases owing to the formation of a trench permiting, however, the soft error to develop due to alpha particles. This is due to the fact that formation of the trench causes the area of the depletion layer to increase, whereby the electric charge produced by alpha particles is easily collected. Furthermore, (2) formation of a deep trench permits a punch through current to flow across the cells. To prevent this current from flowing, the cells must be formed being separated by more than a predetermined distance, making it difficult to form the elements in small sizes. Moreover, (3) an oxide film formed in the trench has a plane index that is deviated from (100). Therefore, if the reliable wet-type oxide film-forming method is employed, the $SiO_2$ film grows to have a thickness about twice that of the oxide film formed on the flat portion, and the capacity is not increased as expected.

SUMMARY OF THE INVENTION

According to the present invention, a trench is provided in a substrate in order to maintain a sufficiently large capacity in a small plane area. Therefore, a large capacity is obtained without a big surface irregularity. Namely, a threedimensional capcitor formed on the substrate and a capacitor formed in the trench in the substrate can be utilized. Further, the trench can be formed in a self-aligned manner with an element (insulating film by the side of gate electrode) as a mask. This makes it possible to eliminate the masking margin in forming the trench. The planar area of the element can be greatly reduced. When the present invention is adapted to a dynamic memory cell, furthermore, a charge storage which constitutes the trench capacitor can be contacted to an impurity-doped region of the transfer MOS transistor in a self-aligned manner. Therefore, since there is no need of providing lines for contact between the two, the memory cell area can be reduced. Since the memory cell area can be reduced, it is allowed to increase the channel length of the transfer MOS transistor correspondingly to enhance reliability with respect to hot carrier resistance.

Further, the soft error resistance can be increased and the leakage current can be prevented from flowing among the cells by forming the capacitors on and in the semiconductor substrate to sufficiently increase the capacity, and by providing an HiC (high-capacitor) structure consisting of a p-type layer and an n-type layer, that had hitherto been flatly provided on the substrate, around the trench between the trench capacitor and the semiconductor substrate.

The object of the present invention is to provide a dynamic random access memory having a trench capacitor to improve the soft error resistance.

Another object of the present invention is to provide a dynamic random access memory having a trench capacitor to prevent the flow of leakage current among the cells.

A further object of the present invention is to provide a dynamic random access memory having a trench capacitor which greatly reduces the area occupied by the memory cells.

These and other objects and many of the attendant advantages of this invention will be readily appreciated as the same becomes better understood by reference to the following detailed description when considered in connection with the accompanying drawings.

DETAILED DESCRIPTION OF THE INVENTION

Figure 1A:
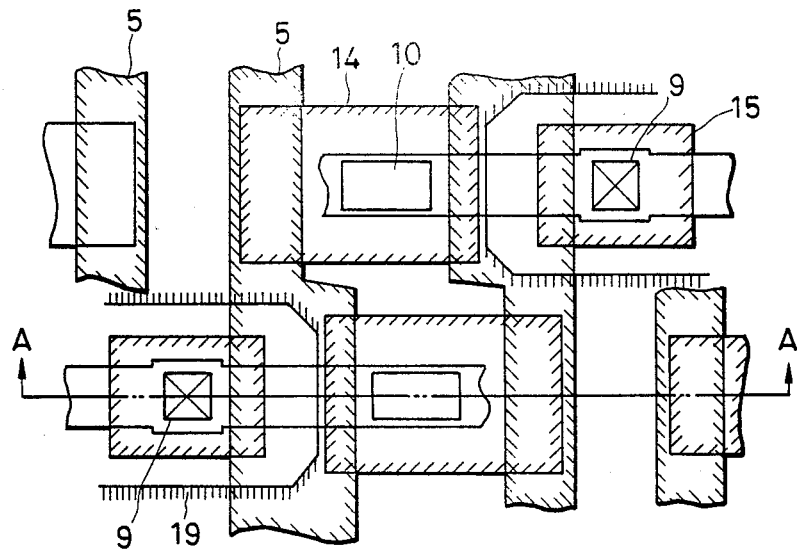
FIGS. 1A to 2F are a plane view and section views illustrating a first embodiment of the present invention.
Figure 1B:
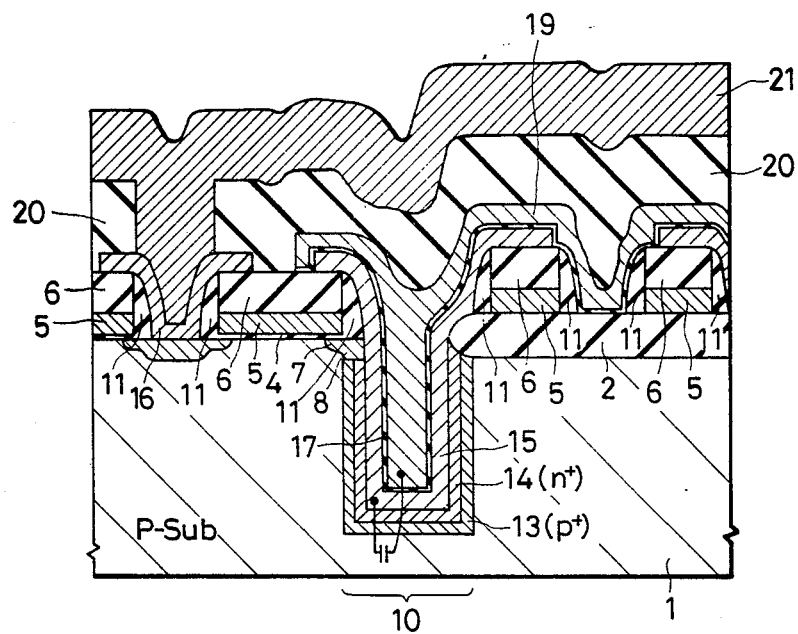

Embodiment 1:

FIG. 1A is a plane view of a dynamic memory cell according to an embodiment of the present invention, and FIG. 1B is a section view along the line A—A of FIG. 1A.

In the drawings, reference numeral 1 denotes a p-type silicon substrate, 2 denotes dielectrics for device isolation, 4 denotes gate dielectrics, 5 denotes a gate electrode or a word line, 6 denotes an insulating film formed on the gate electrode or the word line, 7 denotes an $n^-$-type source or drain, 8 denotes an $n^+$-type source or drain, 9 denotes a contact hole of the bit line, 10 denotes a trench capacitor, 11 denotes an insulating film on the side wall of the gate electrode or the word line 5, 13 denotes a $p^+$-type layer, 14 denotes an $n^+$-type layer, 15 denotes an $n^+$-type polycrystalline silicon layer (charge storage), 17 denotes dielectrics for capacitors, 19 denotes a polycrystalline silicon layer (plate), 16 denotes an $n^+$-type polycrystalline silicon layer in the contact hole 9 of the bit line, 20 denotes a passivation layer, and 21 denotes an aluminum wiring layer.

In the following embodiments of FIGS. 2A to 7, the portions designated by the same reference numerals are the same or equivalent portions to those of FIGS. 1A and 1B, and are not explained unless they are modified.

In this embodiment, the trench of the trench capacitor 10 is formed being self-aligned with respect to the insulating film 11 on the side wall of the gate or the word line 5 and with respect to the insulating film 2 for device isolation. Further, a p+-type layer 13 and an n+-type layer 14 are formed in the trench between the trench capacitor 10 and the semiconductor substrate 1, thereby to constitute a so-called HiC structure of the p+-n+ type.

FIGS. 2A to 2F are section views illustrating the steps in a process for producing memory cells according to an embodiment of the present invention.

Figure 2A:
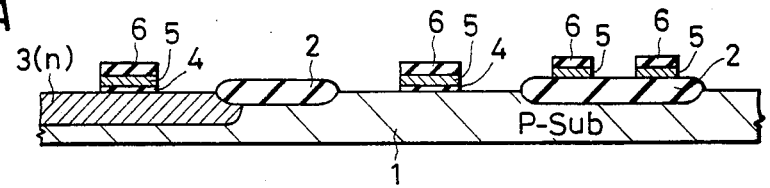

Referring, first, to FIG. 2A, dielectrics for device isolation 2 are formed by the LOCOS method on a p-type silicon substrate 1 having a resistivity of 10 ohms.cm, and then an n-type well 3 is formed to constitute a CMOS. Thereafter, gate dielectrics 4 are formed on the whole surface maintaining a thickness of 20 nm, and a polycrystalline silicon film 5 is deposited on the whole surface maintaining a thickness of 300 nm as a material to form a gate electrode or a word line. The polycrystalline silicon may, of course, be replaced by a silicide such as $WSi_2$, $MoSi_2$ or $TiSi_2$, or by a multi-layer structure, i.e., a polycide structure consisting of such a silicide and polycrystalline silicon. On the whole surface of the polycrystalline silicon film 5 is deposited an insulating film 6 (e.g., an $SiO_2$ film deposited using dichlorosilane as a source) maintaining a thickness of 500 nm. Then, the gate dielectrics 4, polycrystalline silicon films 5 and insulating films 6 are simultaneously patterned by the photolithography process and etching process, in order to form a gate electrode and a word line of a dynamic RAM.

Figure 2B:
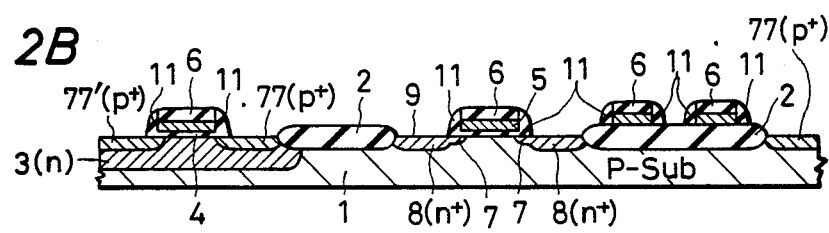

Referring to FIG. 2B, phosphorus (P) ions are implanted using the gate electrode or the word line as a mask, thereby to form an n−-type source/drain 7. This is to form a widely known LDD (lightly doped drain) structure in order to increase the hot carrier resistance. According to the present invention in which a trench 100 (FIG. 2C) for forming the capacitor and the contact hole 9 are formed being self-aligned to the gate electrode or the word line, however, the gate length can be increased and the LDD structure may not, depending upon the cases, be employed. Then a p-type source/drain 77 is formed in the n-type well 3 by the implantation of ions with the gate electrode as a mask.

In the next step, a sidewall insulator 11 is formed on the side surface of the gate electrode or word line 5. Here, the sidewall insulating film 11 is formed by anisotropic etching using the $SiO_2$ film which is deposited using dichlorosilane as a source like the insulating film 6. The width of the insulating film 11 was 0.35 μm. To form the LDD structure, arsenic (As) ions are implanted to form an n−-type source/drain 8. Here, the depth of diffusion was 0.25 μm.

Figure 2C:
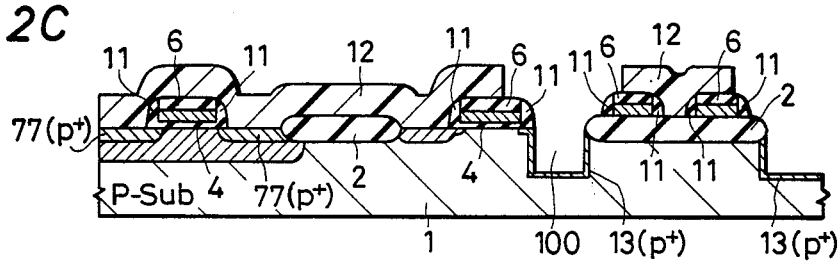
Figure 3:
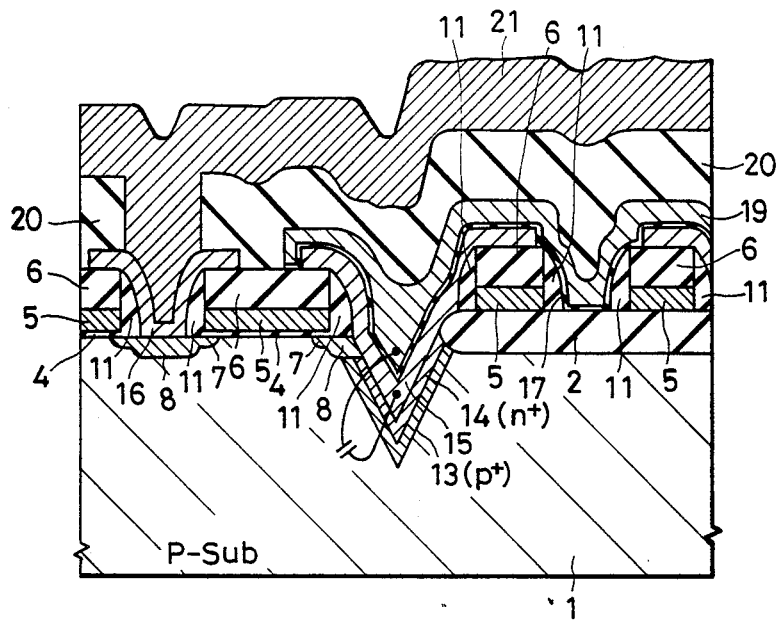
FIG. 3 is a section view illustrating a second embodiment of the present invention.

Thereafter, as shown in FIG. 2C, a resist 12 is deposited on the portions other than the memory capacitor, and the trench 100 is engraved by anisotropic etching. There may be used a multi-layer resist to increase the resistance against etching. The depth of trench is 2 μm. As will be obvious from FIG. 2C, the resist covers the portions where the trenches should not be formed, and the trench is formed in a self-aligned manner using insulating films 6, 11 formed on the upper and side surfaces of the gate electrode or word line 5 and using the insulating film 2 for device isolation as masks. Though the trench was formed by anisotropic etching, it is also allowable to form a V-groove as shown in FIG. 3 using a KOH solution. After the trench 100 is formed, boron (B) ions are implanted into the bottom and sidewall of the trench, and the whole trench is covered by a p+-type impurity-doped layer 13 by the heat-treatment. This is to form the above-mentioned HiC structure in order to decrease the occurrence of soft error caused by alpha particles. A peak concentration of boron ions in the p+-type layer was $2 \times 10^{17}$ cm$^{-3}$. By taking the breakdown voltage of p+-n+ junction into consideration, the peak concentration of boron ions should be from $5 \times 10^{16}$ to $10^{18}$ cm$^{-3}$.

Figure 2D:
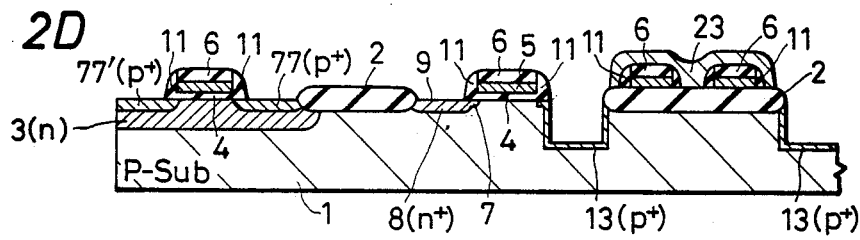

Though the p-type impurity-doped layer was formed by the implantation of ions, it can also be formed by the diffusion method using BN (boron nitride). The surface irregularity is also utilized to more increase the capacity. After the resist 12 is removed, the surface irregularity is formed by an insulating film (composed of the same material as the films 6 and 11) 23 as shown in FIG. 2D.

Figure 2E:
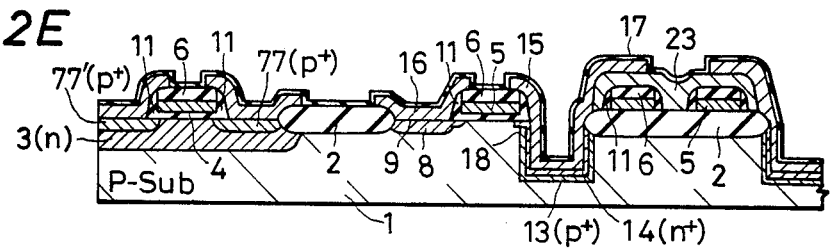
Figure 2F:
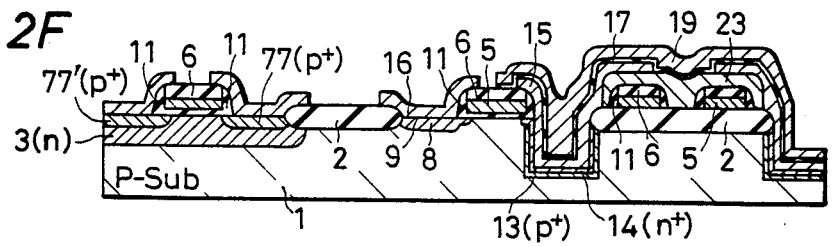

Next, as shown in FIG. 2E, an electrode (charge storage) 14 for taking in or taking out the electric charge, and a layer 15 for preventing the aluminum wiring that will be formed later from penetrating into the contact hole 9 of the bit line, are formed by n+-type doped polycrystalline silicon. The film thickness was 0.25 μm. Owing to the diffusion of impurities from the n+-type doped polycrystalline silicon film 14 by the heat-treatment, the n+-type layer 16 covers the bottom and sidewall of the trench as shown in FIG. 2E. Here, however, the n+-type doped polycrystalline silicon film 15 needs not have a high concentration since it is contacted at the source or drain 8 and 18 of the switching MOS transistor.

In the next step, dielectrics for capacitors 17 are deposited on the polycrystalline silicon film 15 to form a capacitor. The dielectrics for capacitors 17 may be silicon oxide films, silicon nitride films, or multi-layer films consisting of silicon oxide films and silicon nitride films (e.g., $SiO_2/Si_3N_4$ or $SiO_2/Si_3N_4/SiO_2$), or tantalum oxide ($Ta_2O_5$) films. Here, a two-layer film $SiO_2/Si_3N_4$ is used having a thickness of 12 nm reckoned as $SiO_2$. Thereafter, to form the plate of the capacitor, the p-type or n-type polycrystalline silicon film 19 is deposited, and is cut into a predetermined size by the photolithography process and the etching process. The principal process necessary for forming the memory cells of this embodiment is thus finished. Thereafter, the passivation layer (PSG) 20 is deposited, the contact hole is opened in the passivation layer 20, and the aluminum film 21 is deposited and is patterned to form bit lines and contact lines as shown in FIG. 1B. These steps, however, are not diagramed.

Embodiment 2:

FIG. 3 is a section view of a memory cell in which the trench has a V-shape in cross section. According to this embodiment, the process is the same as that of the embodiment 1 except that the process for engraving the trench is different from the trench-engraving process shown in FIG. 2C. That is, according to this embodiment, the trench is engraved by wet etching using a KOH or an $(NH_2)_2$(hydrazine) solution. In this case, the etching does not almost proceed in the lateral direction, and the V-trench can be engraved in a self-aligned manner.

Figure 4:
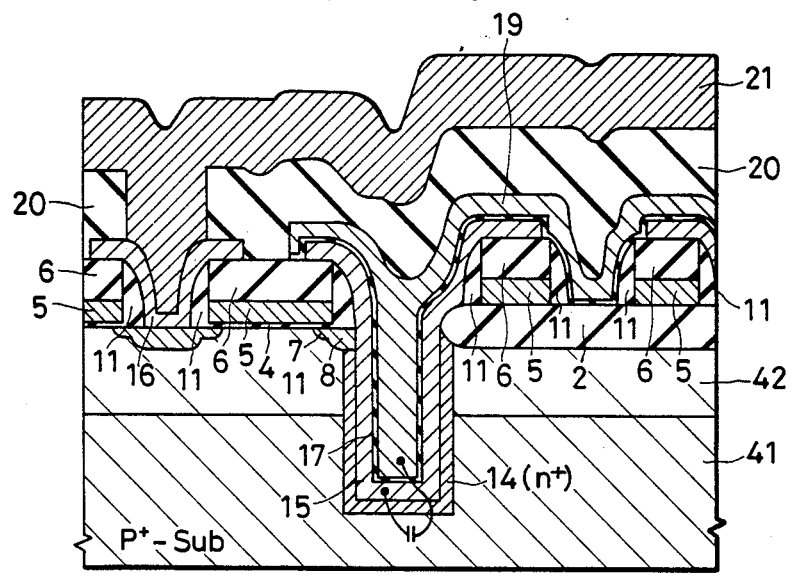
FIG. 4 is a section view illustrating a third embodiment of the present invention.

Embodiment 3:

FIG. 4 is a section view of a memory cell according to the present invention which is fabricated nearly in the same manner as that of the embodiment 1 but which has a difference in the silicon substrate structure. In this case, the silicon substrate consists of a p+-type layer 41 (0.1 to 0.01 ohm.cm) having a high concentration and, formed thereon, a p-type epitaxial layer 42 having a thickness of about 1 to 2 μm and a resistivity of 100 ohms.cm. Therefore, the p+-type region 13 shown in FIG. 1B is not formed. When memory cells and p-channel switching MOS transistors are to be used, there is, of course, used a substrate having an n+-type layer of a high concentration and, formed thereon, an n-type epitaxial layer. When such a substrate is used, there is no need of forming the p+-type layer 13 (FIG. 2C) on the bottom and side walls of the trench. When the p+-type layer 13 is formed, however, the device exhibits a very great resistance against soft error.

Figure 5:
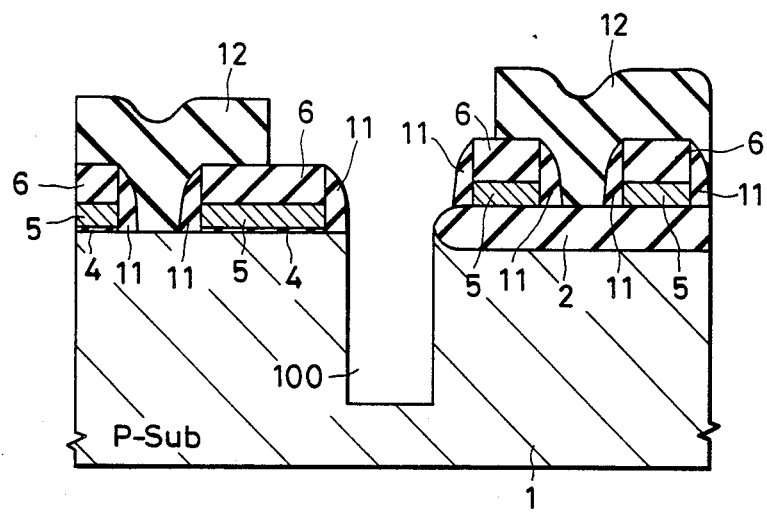
FIGS. 5 and 6 are section views illustrating a fourth embodiment of the present invention.
Figure 6:
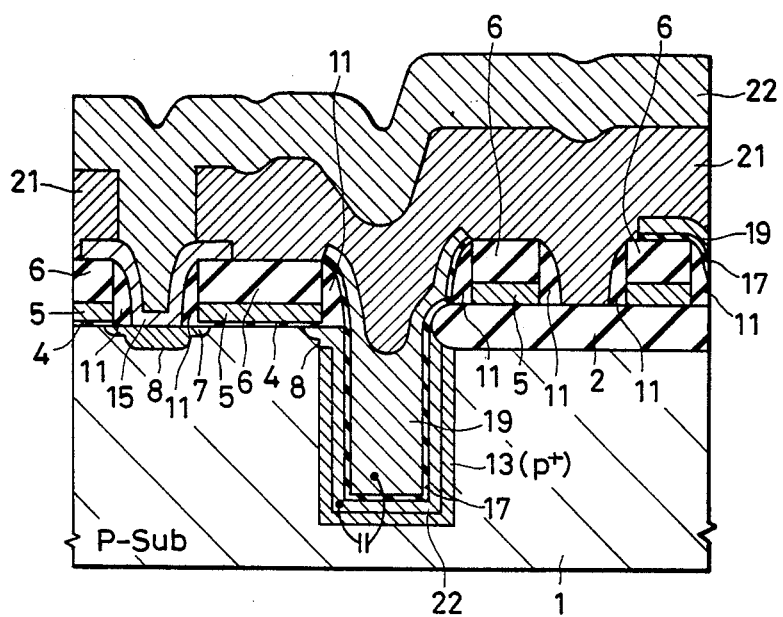

Embodiment 4:

The greatest point of the present invention is that when the trench is formed as shown in FIG. 5, the insulating films (6, 11, 12) such as of SiO₂ are used as masks to engrave the trench 100 in a self-aligned manner. The present invention makes it possible to realize a memory structure as shown in FIG. 6. The feature of this memory cell resides in that the trench is formed in order to increase the capacity of the conventional planar-type memory cell and to increase the area utilized for the capacitor. With the trench being formed in a self-aligned manner as described above, no margin is required for aligning the masks. Further, since the source or drain of the switching MOS transistor is directly contacted to the trench capacitor, no wiring is required to connect them together. Therefore, the cell area can be reduced, and the gate length of the switching MOS transistor can be increased correspondingly. This memory cell can be fabricated through the process which is nearly the same as that of the embodiment 1. In this memory cell, however, the polycrystalline silicon layer 15 shown in FIG. 2E is not formed in the trench to take in or take out the electric charge. Namely, the n+-type layer 22 in the silicon substrate plays this roll. To form the n+-type layer, the trench is formed and then arsenic (As) ions are implanted (not only into the bottom but also into the sidewalls by tilted ion implantation), or antimony (Sb) or arsenic ions are diffused. Next, in order to increase the soft error resistance, the p-type layer 13 is formed around the n+-type layer 22 like in the embodiment 1. The p-type layer 13 is also formed by diffusion or ion implantation.

Figure 7:
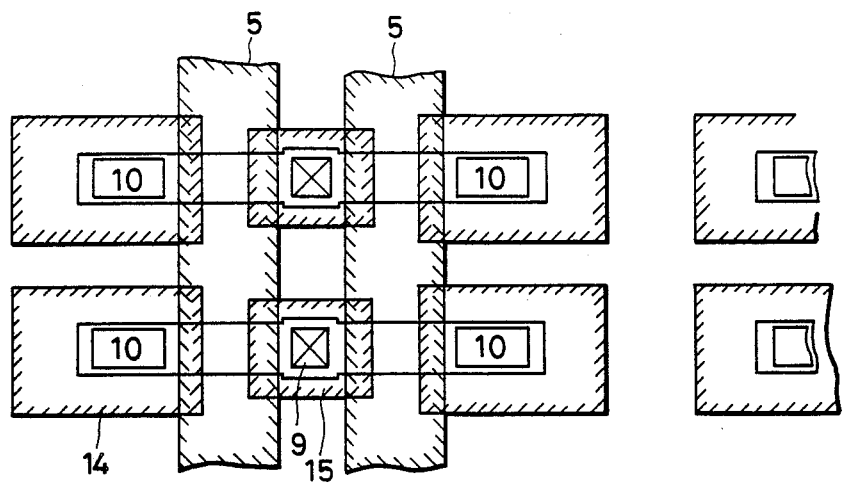
FIG. 7 is a plane view illustrating a fifth embodiment of the present invention.

Embodiment 5:

In the aforementioned embodiments 1 to 4, though the folded bit line cell structure was used as shown in FIG. 1A, it is also allowable to realize the open bit line structure as shown in FIG. 7, as a matter of course. The manufacturing process is the same as that of the embodiment 1, and is not described.

Figure 8:
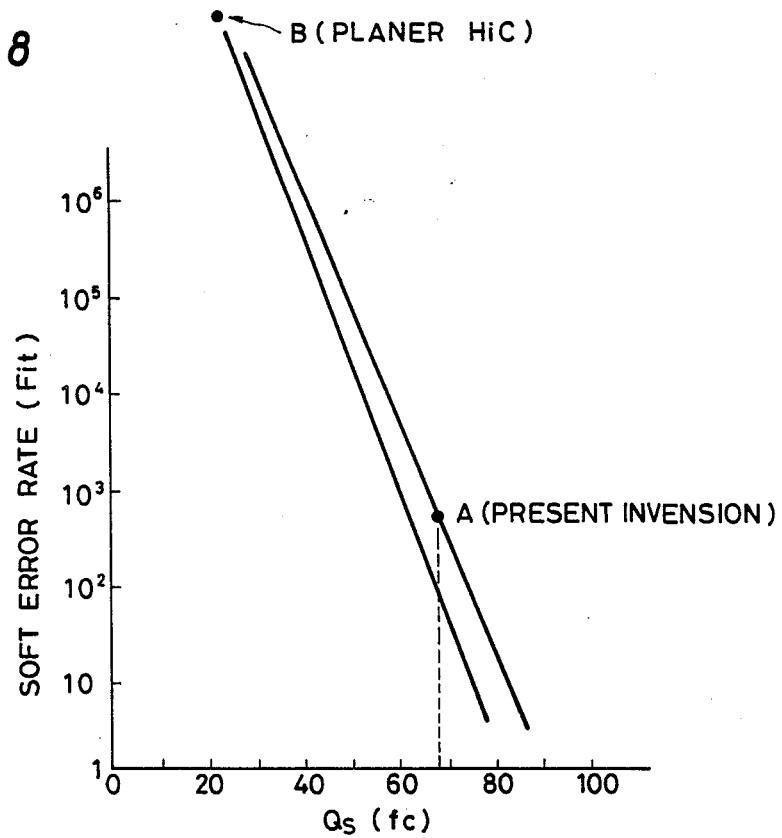
FIG. 8 is a graph illustrating the effects of the present invention.

According to the above-mentioned embodiments 1 to 5, the gate (that also serves as a word line) of the switching MOS transistor, the trench capacitor that forms a portion of the capacitor, and a contact portion can be formed in a self-aligned manner. Compared with the conventional planar structure, therefore, the gate length Lg can be increased by 1.6 times (can be increased from Lg=1.1 μm of the conventional planar structure to Lg=1.7 μm) with the same cell area (e.g., 16 μm²), and the capacity can be increased by about three times. Therefore, the device exhibits a large soft error resistance in cooperation with the HiC structure formed in the trench. FIG. 8 shows the soft error rate of the planar cell having the HiC structure in comparison with the soft error rate of the cell of the present invention having the same cell area. As will be ovbious from FIG. 8, the cell of the present invention having an increased capacity improves the soft error rate greatly.

In the case of the stacked cells of the three-dimensional structure, the surface irregularity of the device structure must be increased with the decrease in the size of the device in order to maintain a large capacity. To decrease the surface irregularity in the above embodiments, the capacitors were formed on the silicon substrate and in the silicon substrate to maintain the same capacity. For instance, formation of the trench which is 1 μm deep helps decrease the surface irregularity by about 1 μm, making it possible to avoid the wiring from breaking, short-circuiting from developing, and the process from becoming complex.

Moreover, with the capacitors being formed on the substrate and in the substrate, there is no need of forming a deep trench (deeper, for instance, than 4 μm) to maintain the same capacity compared with the memory cell in which the capacitor is formed by the trench only. It is therefore possible to increase the soft error resistance against alpha particles, to prevent the flow of leakage current among the cells, to simplify the fabrication process, and to increase the reliability of the oxide film (capacitor insulating film) and of the trench.

According to the semiconductor device having a trench capacitor of the present invention as described above, the trench is formed in a self-aligned manner relative to the elements other than the trench capacitor, making it possible to greatly reduce the cell area. Further, provision of the HiC structure between the trench capacitor and the semiconductor substrate helps increase the soft error resistance and prevent the flow of leakage current among the cells.

It is further understood by those skilled in the art that the foregoing description is a preferred embodiment of the disclosed device and that various changes and modifications may be made in the invention without departing from the spirit and scope thereof.

What is claimed is:

1. A semiconductor device comprising:
    a semiconductor body;
    a field effect transistor provided on the semiconductor body, including a gate electrode and sidewall insulators formed on side surfaces of said gate electrode; and
    a trench capacitor which is at least partly formed in said semiconductor body,
    wherein the trench of said trench capacitor is a substantially vertical wall trench and is formed being self-aligned to said sidewall insulator of said gate electrode, said trench capacitor forming the memory capacitor of a transistor memory cell of a dynamic random access memory,
    and wherein said memory capacitor is provided in the trench and extends over said gate electrode.

2. A semiconductor device comprising:
    a semiconductor body;
    a field effect transistor provided on the semi-conductor body, including a gate electrode and sidewall insulators formed on side surfaces of said gate electrode;
    a trench capacitor which is at least partly formed in said semiconductor body; and a p-type layer and an n-type layer provided between said trench capacitor and said semiconductor body, wherein the trench of said trench capacitor is a substantially vertical wall trench and is formed being self-aligned to said sidewall insulator of said gate electrode, and said trench capacitor forming the memory capacitor of a transistor memory cell of a dynamic random access memory.

3. A semiconductor device comprising:
a semiconductor body;
a field effect transistor provided on the semiconductor body, including a gate electrode and sidewall insulators formed on side surfaces of said gate electrode; and
a trench capacitor which is at least partly formed in said semiconductor body,
wherein the trench of said trench capacitor is a substantially vertical wall trench and is formed being self-aligned to said sidewall insulator of said gate electrode, and said trench capacitor forming the memory capacitor of a transistor memory cell of a dynamic random access memory, and wherein said dynamic random access memory forms a folded bit line structure.

4. A semiconductor device comprising:
a semiconductor body;
a field effect transistor provided on the semi-conductor body, wherein the field effect transistor includes a gate electrode forming a word line, and source and drain regions;
first and second sidewall insulators formed on opposite side surfaces of the gate electrode;
a trench capacitor which is at least partly formed in said semiconductor body, wherein the trench of said trench capacitor is a substantially vertical wall trench and is formed being self-aligned to the first sidewall insulator of the gate electrode by using the first sidewall insulator as a mask;
a capacitor dielectric layer formed over surfaces of the trench; and
a wiring layer connected to the source or drain regions, wherein the wiring layer is a bit line of a dynamic random access memory, wherein said trench capacitor forms the memory capacitor of a transistor memory cell of the dynamic random access memory, and wherein said dynamic random access memory forms a folded bit line structure.

5. A semiconductor device according to claim 1, wherein said semiconductor body is an epitaxial layer formed on a semiconductor substrate.

6. A semiconductor device according to claim 1, wherein said sidewall insulator has a width of 0.35 μm or less.

7. A semiconductor device according to claim 1, wherein said sidewall insulator is formed only on said side surfaces of said gate electrode and does not extend on the top surface of said gate electrode.

8. A semiconductor device according to claim 1, wherein a p-type layer and an n-type layer are provided between said trench capacitor and said semiconductor body.

9. A semiconductor device according to claim 1, wherein said dynamic random access memory forms a folded bit line structure.

10. A semiconductor device according to claim 1, wherein said sidewall insulators each have a width of 0.35 μm or less.

11. A semiconductor device according to claim 1, wherein said sidewall insulators are each formed only on said side surfaces of said gate electrode and do not extend on the top surface of said gate electrode.

12. A semiconductor device according to claim 2, wherein said memory capacitor is provided in the trench and extends over said gate electrode.

13. A semiconductor device according to claim 12, wherein said semiconductor body is an epitaxial layer formed on a semiconductor substrate.

14. A semiconductor device according to claim 2, wherein said dynamic random access memory forms a folded bit line structure.

15. A semiconductor device according to claim 4, further comprising a charge storage layer formed on surfaces of the trench, and extending over the gate electrode, wherein the charge storage layer stores information data of the transistor memory cell, and wherein said capacitor dielectric layer is formed on surfaces of said charge storage layer.

16. A semiconductor device according to claim 4, wherein said semiconductor body is an epitaxial layer formed on a semiconductor substrate.

17. A semiconductor device according to claim 4, wherein a p-type layer and an n-type layer are provided between said trench capacitor and said semiconductor body.

18. A semiconductor device according to claim 16, wherein an impurity concentration of the semiconductor substrate is higher than an impurity concentration of the epitaxial layer.

19. A semiconductor device according to claim 4, further comprising a device isolation insulating film formed on the semiconductor body, wherein the trench of said trench capacitor is self-aligned to the device isolation insulating film.

20. A semiconductor device according to claim 4, wherein the wiring layer is self-aligned to the gate electrode by using the second sidewall insulator as a mask.

21. A semiconductor device according to claim 4, wherein the wiring layer connects to the source or drain region through a polycrystalline silicon layer.

22. A semiconductor device according to claim 4, wherein the source and drain regions include a lightly doped region and a heavily doped region, and the lightly doped region is formed under a gate dielectric.

23. A semiconductor device according to claim 4, wherein the capacitor dielectric layer consists of a silicon oxide film and a silicon nitride film.

24. A semiconductor device according to claim 4, wherein said first and second sidewall insulators each have a width of 0.35 μm or less.

25. A semiconductor device according to claim 4, wherein said first and second sidewall insulators are each formed only on said side surfaces of said gate electrode and do not extend on the top surface of said gate electrode.

26. A semiconductor device according to claim 3, wherein said memory capacitor is provided in the trench and extends over said gate electrode.

27. A semiconductor device according to claim 26, wherein said semiconductor body is an epitaxial layer formed on a semiconductor substrate.

28. A semiconductor device according to claim 3, wherein a p-type layer and an n-type layer are provided between said trench capacitor and said semiconductor body.

29. A semiconductor device according to claim 3, wherein said sidewall insulator has a width of 0.35 μm or less.

30. A semiconductor device according to claim 3, wherein said sidewall insulator is formed only on said side surfaces of said gate electrode and does not extend on the top surface of said gate electrode.

* * * * *